United States Patent [19]
Yoshida

[11] Patent Number: 4,750,191
[45] Date of Patent: Jun. 7, 1988

[54] D/A CONVERTER CAPABLE OF PRODUCING AN ANALOG SIGNAL HAVING LEVELS OF A PRESELECTED NUMBER DIFFERENT FROM $2^N$ AND COMMUNICATION NETWORK COMPRISING THE D/A CONVERTER

[75] Inventor: Yasuharu Yoshida, Tokyo, Japan
[73] Assignee: NEC Corporation, Japan
[21] Appl. No.: 794,662
[22] Filed: Nov. 4, 1985
[30] Foreign Application Priority Data
Nov. 6, 1984 [JP] Japan ................... 59-233825
Nov. 6, 1984 [JP] Japan ................... 59-233827
[51] Int. Cl.$^4$ ................................ H04L 27/02
[52] U.S. Cl. ................... 375/39; 332/9 R; 340/347 AD; 375/25
[58] Field of Search ............ 375/4, 19, 25, 27, 38, 375/39; 370/110.1, 110.4; 340/347 DA; 332/9 R, 31; 371/43, 44, 46

[56] References Cited
U.S. PATENT DOCUMENTS
4,484,178 11/1984 Lovgren .................. 340/347 DA
4,520,490 5/1985 Wei ............................ 375/27
4,534,040 8/1985 Thapar ....................... 375/39
4,584,564 4/1986 Bernardson ............. 340/347 DA Primary Examiner—Benedict V. Safourek
Attorney, Agent, or Firm—Laff, Whitesel, Conte & Saret

[57] ABSTRACT

In a digital-to-analog converter, a digital input signal of x bits is subjected to digital-to-analog conversion with at least two of x bit positions recognized as a common bit position and converted into analog levels of a number which is different from $2^x$ where x is an integer. At least one additional common bit position may be selected from the x bit positions except the common bit position. The digital input signal may be pre-processed by the use of a logic circuit prior to the digital-to-analog conversion so as to control the number of analog levels. The digital-to-analog converter is applicable to a modulator which produces a quadrature amplitude modulated signal having a circular arrangement of signal points on a phase plane. A demodulator comprises an analog-to-digital converter for converting the above-mentioned analog signal into a reproduction of the digital input signal.

7 Claims, 4 Drawing Sheets

| SPECIFIC SIGNAL POINTS | Sp2 | Sp3 | Sp4 | Sq2 | Sq3 | Sq4 | Sp2' | Sp3' | Sp4' | Hp | Sq2' | Sq3' | Sq4' | Hq |
|---|---|---|---|---|---|---|---|---|---|---|---|---|---|---|
| a → a' | 0 | 0 | 0 | 0 | 0 | 0 | 0 | 0 | 0 | 1 | 1 | 1 | 1 | 0 |
| b → b' | 0 | 0 | 0 | 0 | 0 | 1 | 0 | 0 | 0 | 1 | 1 | 0 | 1 | 0 |
| c → c' | 0 | 0 | 0 | 0 | 1 | 1 | 0 | 0 | 0 | 1 | 1 | 0 | 0 | 0 |
| d → d' | 0 | 0 | 1 | 0 | 0 | 0 | 1 | 1 | 1 | 0 | 0 | 0 | 0 | 1 |
| e → e' | 0 | 1 | 1 | 0 | 0 | 0 | 1 | 0 | 1 | 0 | 0 | 0 | 0 | 1 |
| f → f' | 0 | 0 | 1 | 0 | 0 | 1 | 1 | 0 | 0 | 0 | 0 | 0 | 0 | 1 |

D/A CONVERTER CAPABLE OF PRODUCING AN ANALOG SIGNAL HAVING LEVELS OF A PRESELECTED NUMBER DIFFERENT FROM $2^N$ AND COMMUNICATION NETWORK COMPRISING THE D/A CONVERTER

BACKGROUND OF THE INVENTION

This invention relates to a digital-to-analog converter and to a digital communication network comprising the digital-to-analog converter.

A digital-to-analog converter is indispensable for a digital communication network. For example, the digital-to-analog converter is used in quadrature amplitude modulation to produce a quadrature amplitude modulated signal in response to a first and a second digital input signal each of which is represented by N bits, where N is an integer equal to or greater than three. In this event, the quadrature amplitude modulated signal has signal points equal to $M^2$ on a phase plane, where M is equal to $2^N$.

A conventional digital-to-analog converter usually converts the digital input signal of N bits into an analog signal having $2^N$ or M levels.

In U.S. patent application Ser. No. 779,217 filed Sept. 23, 1985 by Junichi Uchibori et al for assignment to NEC Corporation, now U.S. Pat. No. 4,675,619, a device is disclosed which circularly arranges the $M^2$ signal points. Such a circular arrangement or distribution of signal points serves to reduce an amplitude of the analog signal, as mentioned in the above-mentioned Patent Application.

In the meanwhile, the circular distribution inevitably gives rise to occurrence of extra or additional levels which are different from the $2^N$ levels It is to be noted that the Uchibori et al application does not specifically teach a digital-to-analog converter which can convert such additional levels into the analog signal. In addition, an analog-to-digital (A/D) converter becomes necessary on demodulation of the quadrature amplitude-modulated signal in the digital communication network to produce the digital signals converted in the above-mentioned manner.

SUMMMARY OF OF THE INVENTION

It is an object of this invention to provide a digital-to-analog converter which is capable of producing an analog signal of levels of a number which is not equal in number to $2^N$.

It is another object of this invention to provide a modulator which can produce a quadrature amplitude-modulated signal having a circular arrangement of signal points.

It is still another object of this invention to provide an analog-to-digital converter which is for use in combination with the digital-to-analog converter mentioned above.

It is yet another object of this invention to provide a demodulator which is communicable with a modulator of the type described.

A digital-to-analog converter to which this invention is applicable is for use in converting a digital input signal of x bits into an analog output signal, where x is an integer which is not smaller than three. The x bits are consecutively placed at first through x-th bit positions, respectively. The analog output signal takes a plurality of levels. According to this invention, the converter comprises processing means responsive to the digital input signal for processing at least two of the x bit positions as a common bit position to produce a processed digital signal of x bits having the common bit position and converting means for converting the processed digital signal into the analog output signal which takes the levels of a number which is different from $2^x$.

DESCRIPTION OF THE PREFERRED EMBODIMENTS

Figure 1:
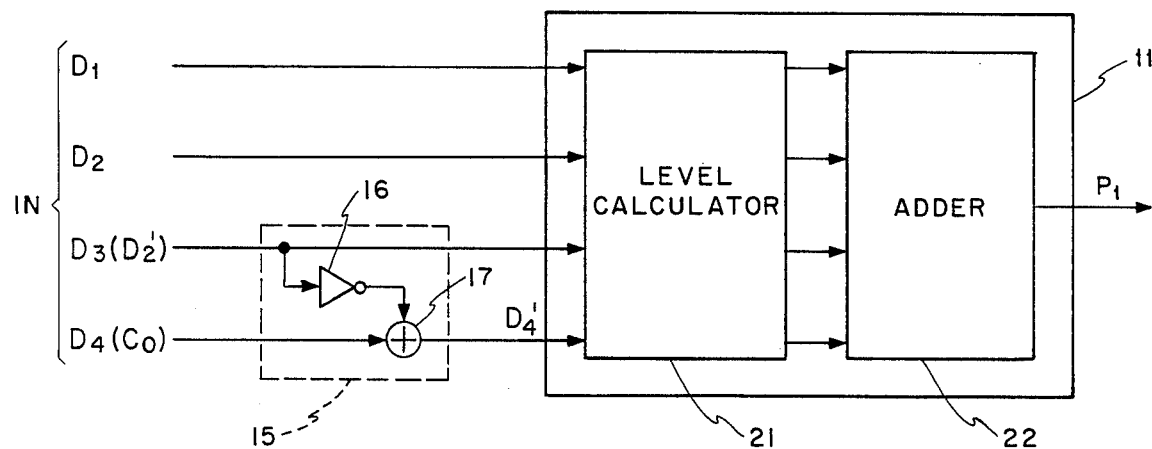
FIG. 1 is a block diagram of a digital-to-analog converter according to a first embodiment of this invention.

Referring to FIG. 1, a digital-to-analog converter according to a first embodiment of this invention is for use in converting a digital input signal IN of four bits into an analog output signal $P_1$ having a plurality of levels. The four bits of the digital input signal IN are consecutively numbered from a first bit $D_1$ to a fourth bit $D_4$ which are placed at first through fourth bit positions, respectively. Therefore, the digital input signal IN may be represented by:

$$D_1 \cdot 2^3 + D_2 \cdot 2^2 + D_3 \cdot 2^1 + D_4 \cdot 2^0.$$

In other words, the digital input signal IN of four bits can represent sixteen levels ($=2^4$), as is well known in the art.

In the illustrated converter, the second and third bit positions for the second and third bits $D_2$ and $D_3$ are recognized as a common bit position while the first and fourth bit positions for the first and fourth bits $D_1$ and $D_4$ are recognized as most and least significant bit positions, respectively. The third bit $D_3$ may be represented by $D_2'$ so as to clarify a relationship between the second and third bits. This means that the input digital signal IN of four bits is internally processed as a three bit signal in the digital-to-analog converter. In this connection, it may be presumably considered that the digital input signal IN is recognized as a recognized digital signal which has four bits like the input digital signal IN and which is given by:

$$(-1)^{D_1} \cdot 2^2 + (-1)^{D_2} \cdot 2^1 + (-1)^{D_3} \cdot 2^1 + (-1)^{D_4} \cdot 2^0. \tag{1}$$

It is understood that Formula (1) takes a maximum value or level when the four bits ($D_1 D_2 D_3 D_4$) of the recognized digital signal are equal to (0000) while Formula (1) takes a minimum value or level when the four bits ($D_1 D_2 D_3 D_4$) are equal to (1111). The maximum and minimum values may be represented by 9k and $-9k$, respectively, where k is representative of a constant. In addition, it is also understood that Formula (1) can represent ten levels between 9k and −9k, both inclusive, with a level interval kept equal to 2k. In other words, the recognized digital signal can represent a plurality of levels which are not equal in number to $2^3$ or $2^4$.

At any rate, connections for the four bits of the digital input signal IN may be considered as a recognizing circuit for recognizing the second and third bit positions as a common bit position.

The recognized digital signal may directly be converted into an analog signal which can take ten different analog levels.

However, the illustrated converter processes the recognized digital siganl into a processed signal in consideration of application of the illustrated converter to a quadrature amplitude modulator which will be described later in detail.

More specifically, the first, second, and third bits $D_1$, $D_2$, and $D_3$ of the recognized digital signal are sent as first through third bit signals of the processed digital signal to a digital-to-analog conversion circuit 11 as they are kept intact. In addition, the third and fourth bits $D_3$ and $D_4$ of the recognized digital signal are supplied to a logic circuit 15 which comprises a NOT circuit, namely, inverter 16 and an Exclusive OR circuit, namely, adder (mod 2) 17. The inverter 6 inverts or negates the third bit $D_3$ to supply the Exclusive OR circuit 17 with an inverted bit which may be represented by $\overline{D}_3$. The Exclusive OR circuit 17 performs the Exclusive OR between the fourth bit $D_4$ of the recognized digital siganl and the inverted bit $\overline{D}_3$ to produce a fourth bit signal of the processed digital signal. The fourth bit signal of the processed digital signal will be represented by $D_4'$.

Under the circumstances, Formula (1) is rewritten into:

$$(-1)^{D_1} \cdot 2^2 + (-1)^{D_2} \cdot 2^1 + (-1)^{D_3} \cdot 2^2 + (-1)^{D_4'} \cdot 2^0, \quad (2)$$

where $D_4'$ is represented by $\overline{D}_3 \oplus D_4$.

If the fourth bit $D_4$ of the recognized digital signal takes a logic "0" level, the processed digital signal is representative of maximum and minimum ones of levels given by 7k and −7k, respectively. The number of the levels is equal to $2^3 (=8)$. A level interval between two adjacent ones of the levels can be represented by 2k like in Formula (1). 15, On the other hand, if the fourth bit $D_4$ takes a logic "1" level, the processed digital signal can represent maximum and minimum levels given by 9k and −9k when the first through third bits $D_1$ to $D_3$ are equal to "000" and "111." In this case, the number of the levels can be represented by $(2^3+2)$. Each level is arranged with the level interval kept equal to 2k.

At any rate, the illustrated converter can change the number of levels in response to the fourth bit $D_4$ of the recognized digital signal. The first through fourth bit signals $D_1$, $D_2$, $D_3$, and $D_4'$ are supplied to the digital-to-analog conversion circuit 11 as the processed digital signal. Thus, the logic circuit 15 and connections for the digital-to-analog circuit 11 may be called a processing circuit for processing the recognized digital signal into the processed digital signal.

The digital-to-analog conversion circuit 11 converts the processed digital signal into the analog output signal $P_1$ which has the levels corresponding to the processed digital signal. The number of the levels is controllable by the fourth bit $D_4$ of the recognized digital signal. For example, the analog output signal $P_1$ can take eight and ten levels when the logic "0" and "1" levels are given as the fourth bit $D_4$ of the recognized digital signal, respectively. In this sense, the fourth bit $D_4$ may be called a control bit $C_0$ placed at the least significant bit.

The digital-to-analog conversion circuit 11 comprises a level calculator 21 and an adder 22. Responsive to the processed digital signal of four bits, the level calculator 21 converts the level of the processed digital signal into a level-adjusted digital signal in accordance with Formula (2). The level calculator may be a resistor circuit for calculating the number of the levels in consideration of the common bit position in accordance with Formula (2). The adder 22 adds the level-adjusted digital signal to produce the analog output signal $P_1$. The illustrated analog output signal takes eight or ten levels in response to the fourth bit $D_4$ of the recognized digital signal, as mentioned before. At any rate, the illustrated converter produces the analog output signal $P_1$ of levels of a number which is between $2^3$ and $2^4$ and will be called a converter for three bits.

Figure 2:
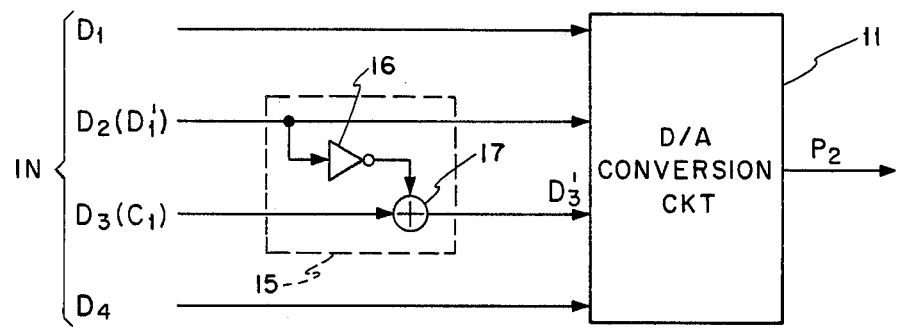
FIG. 2 is a block diagram of a digital-to-analog converter according to a second embodiment of this invention.

Referring to FIG. 2, a digital-to-analog converter according to a second embodiment of this invention comprises similar parts and signals designated by like reference numerals and symbols. The second bit position for the second bit $D_2$ is recognized as a most significant bit position, namely, $D_1'$ like the first bit position for the first bit $D_1$ and is therefore processed as a particular bit position common to the first bit position. From this fact, it is readily understood in FIG. 2 that the input digital signal IN of four bits is recognized as a recognized digital signal given by:

$$(-1)^{D_1} \cdot 2^2 + (-1)^{D_2} \cdot 2^2 + (-1)^{D_3} \cdot 2^1 + (-1)^{D_4} \cdot 2^0. \quad (3)$$

Like in FIG. 1, the logic circuit 15 comprises an inverter 16 and the Exclusive OR circuit 17 connected to the inverter 16. The illustrated logic circuit 15 processes the second and third bits $D_2$ and $D_3$ of the recognized digital signal in a manner similar to that illustrated in FIG. 1.

As a result, the illustrated conversion circuit 11 is supplied through the processing circuit, such as the logic circuit 15, with the processed digital signal given by:

$$(-1)^{D_1} \cdot 2 + (-1)^{D_2} \cdot 2^2 + (-1)^{D_3'} \cdot 2^1 + (-1)^{D_4} \cdot 2^0, \quad (4)$$

where $D_3'$ is given by:

$D_3' = D_2 \oplus D_3$.

Accordingly, the conversion circuit 11 produces an analog output signal $P_2$ represented by Formula (4) in a manner similar to that illustrated in FIG. 1.

In FIG. 2, the third bit $D_3$ of the recognized digital signal is used as a control signal $C_1$ for the least significant bit but one. If the third bit $D_3$ takes the logic "0" level, the three remaining bits ($D_1$, $D_2$, $D_4$) are subjected to digital-to-analog conversion. In this event, the analog output signal $P_2$ takes eight different levels with the level interval kept at 2k. From Formula (4), it is readily seen that the maximum and minimum levels of the analog output signal $P_2$ are equal to 7k and −7k, respectively, on condition that the third bit $D_3$ takes the logic "0" level.

If the third bit $D_3$ takes the logic "1" level, the analog output signal P is represented by 11k and −11k when the first, second, and fourth bits $D_1$, $D_2$, and $D_4$ are equal to (000) and (111). Likewise, the analog output signal $P_2$ is given by 9k and $-9k$ when the first, second, and fourth bits $D_1$, $D_2$, and $D_4$ are equal to (001) and (110). Thus, the analog output signal $P_2$ takes twelve different levels ($=2^3+4$). In other words, two levels are added to eight levels ($=2^3$) on each side of the eight levels.

The converter illustrated in FIG. 2 is operable to produce the analog output signal $P_2$ of levels of a number which is between $2^3$ and $2^4$ like in FIG. 1 and will also be called a converter for three bits.

Figure 3:
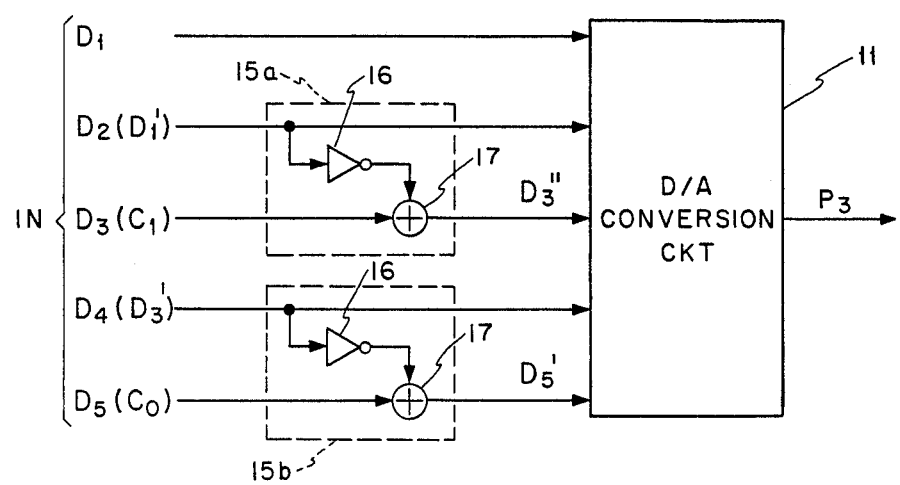
FIG. 3 is a block diagram of a digital-to-analog converter according to a third embodiment of this invention.

Referring to FIG. 3, a digital-to-analog converter according to a third embodiment of this invention is similar to that illustrated in FIG. 2 except that the digital input signal IN of five bits is supplied to the converter illustrated in FIG. 3 and is processed into a processed digital signal of five bits by the use of first and second logic circuits depicted at 15a and 15b, respectively. Each of the first and second logic circuits 15a and 15b comprises an inverter 16 and an Exclusive OR circuit 17 like the logic circuit 15 illustrated in FIGS. 1 and 2.

In FIG. 3, the second bit position for the second bit $D_2$ of the digital input signal IN is recognized as the first bit position fof the first bit $D_1$. Likewise, the fourth bit position for the fourth bit $D_4$ of the digital input signal IN is recognized as the third bit position for the third bit $D_3$. In this connection, the second and fourth bits $D_2$ and $D_4$ may be represented by $D_1'$ and $D_3'$, respectively. In addition, the first and second bit positions will be referred to as a first common bit position while the third and fourth bit positions, a second common bit position.

Under the circumstances, the recognized digital signal of five bits is represented by:

$$(-1)^{D_1} \cdot 2^2 + (-1)^{D \cdot 2} 2 + (-1)^{D_3} \cdot 2^1 + (-1)^{D_4} \cdot 2^1 + (-1)^{D_5} \cdot 2^0. \quad (5)$$

The recognized digital signal is processed by the processing circuit, such as the first and second logic circuits 15a and 15b, into a processed digital signal of five bits including the first and second common bit positions. More specifically, the first, second, and fourth bits of the processed digital signal are equal to the first, second, and fourth bits $D_1$, $D_2$, and $D_4$ of the recognized digital signal, respectively. Third and fifth bits $D_3''$ and $D_5'$ of the processed digital signal are represented by:

$$\begin{matrix} D_3'' & = & D_2 \oplus D_3 \\ \text{and} \quad D_5' & = & D_4 \oplus D_5, \text{ respectively.} \end{matrix} \quad (6)$$

Thus, the processed digital signal is given by substituting Equations (6) into Formula (5) and results in:

$$(-1)^{D_1} \cdot 2^2 + (-1)^{D_2} \cdot 2^2 + (-1)^{D_3''} \cdot 2^1 + (-1)^{D_4} \cdot 2^1 + (-1)^{D_5'} \cdot 2^0. \quad (7)$$

The illustrated converter produces the output analog signal $P_3$ given by Formula (7).

In the example being illustrated, the third and fifth bits $D_3$ and $D_5$ of the recognized digital signal are used as a control signal having first and second control bits $C_1$ and $C_0$.

Let the control signal ($C_1C_0$) be equal to (00). In this event, the first, second, and fourth bits $D_1$, $D_2$, and $D_4$ of the recognized digital signal are converted by the digital-to-analog conversion circuit 11 in accordance with Formula (7) into the analog output signal $P_3$. The analog output signal $P_3$ takes eight different levels with a level interval kept at 2k. The maximum and minimum ones of the levels are represented by "7k" and "$-7k$," respectively.

If the control signal ($C_1C_0$) is equal to "01," the analog output signal $P_3$ takes a maximum level of "9k" and a minimum level of "$-9k$" on condition that the first, second, and fourth bits $D_1$, $D_2$, and $D_4$ are equal to "000" and "111," respectively. The analog output signal P has ten different levels between the maximum and minimum levels, both inclusive, with the level interval kept at 2k.

Similarly, if the control signal ($C_1C_0$) is equal to "10," the analog output signal $P_3$ takes a maximum level of "11k" and a minimum level of "$-11k$" on condition that the first, second, and fourth bits $D_1$, $D_2$, and $D_4$ are equal to "000" and "111," respectively. Accordingly, the analog output signal $P_3$ has twelve different levels between the maximum and minimum levels, both inclusive. The level interval is represented by 2k.

Let the control signal ($C_1C_0$) be equal to (11). The analog output signal $P_3$ takes a maximum level of "13k" and a minimum level of "$-13k$" when the first, second, and fourth bits $D_1$, $D_2$, and $D_4$ are equal to "000" and "111," respectively. From this fact, it is readily understood that the analog output signal $P_3$ has fourteen different levels between the maximum and minimum levels, both inclusive.

Anyway, the illustrated converter produces the output analog signal having a selected one of eight, ten, twelve, and fourteen levels in response to the control signal. The levels of the output analog signal are smaller in number than $2^4$. In this connection, the converter illustrated in FIG. 3 will be called a converter for three bits.

Consideration will be made as regards a digital-toanalog converter for n bits with reference to FIGS. 1 through 3. In this event, such a digital-to-analog converter can produce an analog output signal of levels of a maximum number which is equal to ($2^{n+1}-2$). Taking the converter illustrated in FIG. 3 into consideration, the digital-to-analog converter for n bits is supplied with the digital input signal IN of ($2n-1$) bits. The digital input signal is recognized as a recognized digital signal which is divided into a data signal of n bits and a control signal of ($n-1$) bits. The data signal of n bits has two upper significant bit positions recognized as a common bit position and the remaining bits recognized as common to the corresponding bits of the control signal, respectively, like in FIG. 3. The ($n=1$) bits of the control signal may be represented by ($E_{n-2}E_{n-1} \ldots E_0$).

In addition, the digital-to-analog converter for n-bits comprises a plurality of logic circuits, ($n-1$) in number, each of which is similar to that illustrated in FIGS. 1 through 3. Therefore, each logic circuit may comprise an inverter and an Exclusive OR circuit.

With this structure, the data signal of n bits is converted into the analog output signal of $2^n$ levels when the ($n=1$) bits of the control signal take "00 . . . 0." On the other hand, the analog output signal takes the maximum number of levels equal to ($2^{n+1}-2$) when the ($n-1$) bits of the control signal take "11 . . . 1."

Figure 4:
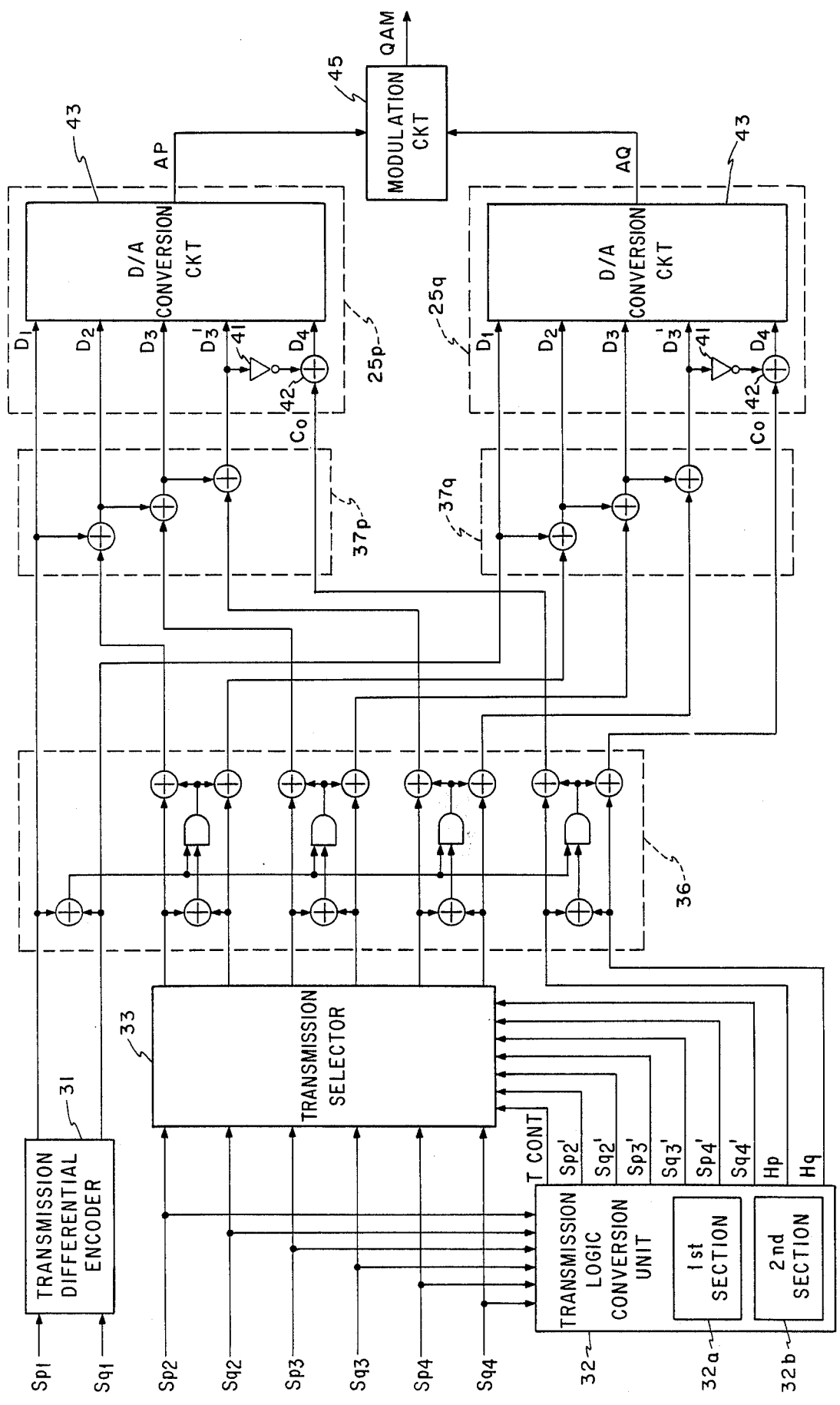
FIG. 4 is a block diagram of a modulator comprising a digital-to-analog converter according to a fourth embodiment of this invention.

Referring to FIG. 4, a modulator is for use in 256-quadrature amplitude modulation (QAM) in a digital communication network and is supplied with a p-channel digital signal and a q-channel digital signal to produce a quadrature amplitude modulated signal QAM. The p- and q-channel digital signals may be called first and second digital input signals, respectively. The illustrated modulator comprises first and second digital-to-analog converters $25p$ and $25q$ according to a fourth embodiment of this invention. The p-channel digital signal consists of first, second, third, and fourth bit signals $S_{p1}$, $S_{p2}$, $S_{p3}$, and $S_{p4}$. Likewise, the q-channel digital signal consists of first through fourth bit signals $S_{q1}$ to $S_{q4}$. The first bit signals $S_{p1}$ and $S_{q1}$ of the p- and q-channel signals are assumed to be placed at a most significant bit position while the fourth bit signals $S_{p4}$ and $S_{q4}$ are assumed to be placed at a least significant bit position. Accordingly, each of the p- and q-channel digital signals specifies $2^4$ (=16) levels, as is readily understood. As a result, a combination of the p- and q-channel digital signals can represent different values of 256 and produced as the quadrature amplitude modulated signal QAM. The respective values of 256 appear as corresponding signal points on a phase plane of the quadrature amplitude modulated signal QAM. As is well known in the art, the phase plane is divided into first, second, third, and fourth quadrants to which sixty-four signal points are equally assigned, respectively.

Figures 5, 6:
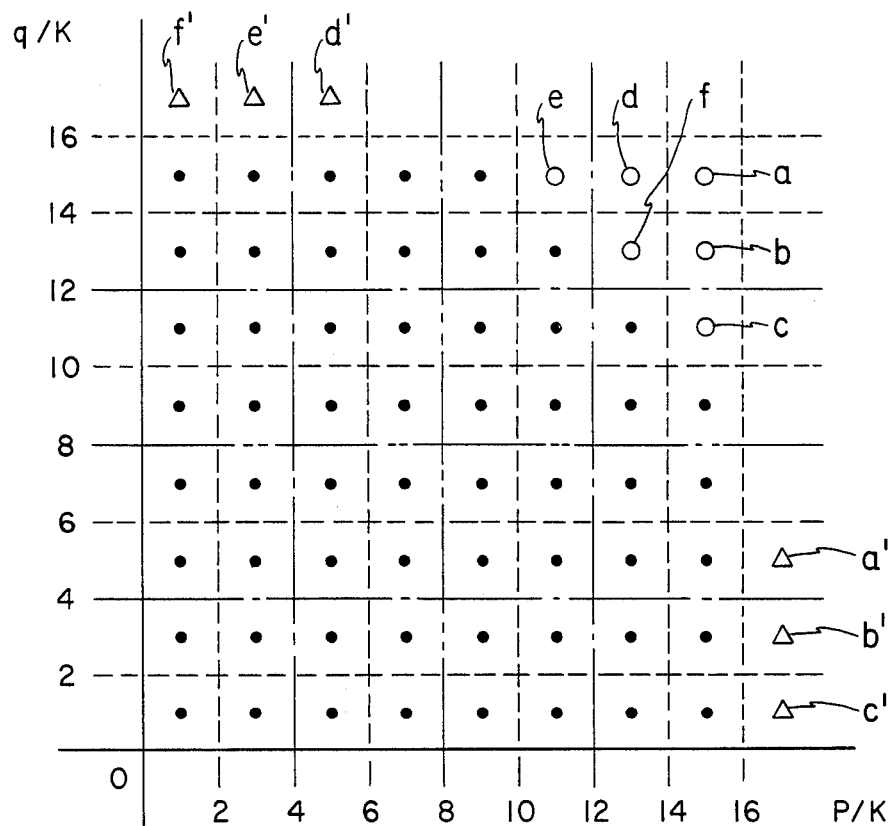
FIG. 5 is a view for use in describing square and circular arrangement of signal points on a phase plane.
FIG. 6 is a view for use in describing operation of a transmission logic conversion unit illustrated in FIG. 4; and, FIG. 7 is a block diagram of a demodulator for use in combination with the modulator illustrated in FIG. 4.

Referring to FIG. 5 together with FIG. 4, an arrangement or distribution of the signal points will be discussed hereinunder. By way of example, the illustrated signal points are placed in the first quadrant. In FIG. 5, the abscissa and ordinate represent normalized levels of the p- and q-channel signals which are depicted at p/k and q/k, respectively, and which may be called p-axis and q-axis, respectively. The p- and q-axes are crossed at origin O.

For a better understanding of this invention, let the signal points be distributed on the phase plane in a usual or conventional manner. In this event, outermost ones of the signal points form a square in the first quadrant, as shown by black circular spots and white circular spots a to f. As long as such a square arrangement of the signal points is formed on the phase plane, each signal point can be represented by the combination of the first through fourth bit signals, namely, eight bit signals of the p- and q-channel signals. However, the square arrangement of the signal points brings about an increase of a peak amplitude of a quadrature amplitude modulated signal. The peak amplitude is determined by a distance between the origin O and the white circular spot a.

In the above-referenced United States Patent Application, a modulator is disclosed which produces a quadrature amplitude modulated signal having a circular arrangement of the signal points on the phase plane. For this purpose, a plurality of signal points are moved or dislocated which are adjacent to a corner of the square. In FIG. 5, the white circular spots a to c are shifted or dislocated towards the p-axis into dislocated signal points a', b', and c', respectively, while the remaining white circular spots d, e, and f are shifted towards the q-axis into dislocated signal points d', e', and f', respectively. The corresponding signal points are also moved in the second, third, and fourth quadrants. Consequently, the outermost ones of the signal points are contoured nearly at a circle. The black and white circular spots will be referred to as normal and specific signal points, respectively. In this connection, the circular arrangement is divisible into a first part for the normal signal points and a second part for the dislocated signal points.

With such a circular arrangement or distribution of the signal points, it is possible to reduce a peak amplitude of the quadrature amplitude modulated signal in comparison with the square arrangement of signal points.

For example, the peak amplitude of the square arrangement is assumed to be represented by $15\sqrt{2}$. On the other hand, the peak amplitude of the circular arrangement is given by a distance between the origin O and the specific signal point d' and becomes equal to $\sqrt[3]{314}$. Therefore, the peak amplitude of the circular arrangement becomes about 0.84 time that of the square arrangement.

In FIG. 5, each of the p- and q-axes provides a first line for discriminating the first bit signal ($S_{p1}$ or $S_{q1}$) while each second line placed at eighth levels (8) are for discriminating the second bit signal ($S_{p2}$ or $S_{q2}$). Likewise, each third line which is placed at fourth and twelfth levels (4 and 12) is for discriminating the third bit signal or ($S_{p3}$ or $S_{q3}$) while each fourth line which is placed at second, sixth, tenth, and fourteenth levels is for discriminating the fourth bit signal ($S_{p4}$ or $S_{q4}$).

In addition, a fifth line placed at a sixteenth level is for discriminating shifted or dislocated signal points a' to f'. At any rate, the first through fifth lines correspond to threshold levels for discriminating the respective bit signals of each of the p- and q-channel digital signals. It is to be noted that the dislocated signal points a' to f' can not be represented by a combination of eight bits, although the normal signal points can be represented by eight bits.

In FIG. 4, the quadrature amplitude modulated signal QAM has a circular arrangement of signal points, as illustrated in FIG. 5. In order to provide such a circular arrangement, code conversion is carried out in the illustrated modulator. In addition, further code conversion is carried out so as to produce rotation symmetry codes in a manner to be described later and will be referred to as rotation symmetry conversion.

The illustrated modulator comprises a transmission differential encoder 31 successively supplied with the first bit signals $S_{p1}$ and $S_{q1}$ of the p- and q-channel digital signals as first bit sequences, respectively. The transmission differential encoder 31 is operable in a known manner to produce a pair of encoded bit signals each of which is representative of a difference between two adjacent bits of each first bit sequence. The transmission differential encoder 31 serves to avoid any influence resulting from uncertainty of phases of a reference carrier signal reproduced in a receiver.

The second through fourth bit signals $S_{p2}$ to $S_{p4}$ and $S_{q2}$ to $S_{q4}$ are delivered to a transmission logic conversion unit 32 and to a transmission selector 33 coupled to the transmission logic conversion unit 32.

Temporarily referring to FIG. 6, the transmission logic conversion unit 32 detects whether or not the second through fourth bit signals $S_{p2}$ to $S_{p4}$ and $S_{q2}$ to $S_{q4}$ are representative of the specific signal points, such as a to f. In other words, the transmission logic conversion circuit 32 determines whether both of the second through fourth bit signals $S_{p2}$ to $S_{p4}$ and $S_{q2}$ to $S_{q4}$ are representative of either of the normal and specific signal points. To this end, the transmission logic conversion unit 32 comprises a first section 32a for supplying the transmission selector 33 with a transmission control signal TCONT representative of either of the normal and specific signal points. In the illustrated transmission logic conversion unit 32, the transmission control signal TCONT takes the logic "0" and "1" levels when the second through fourth bit signals are representative of the normal and specific signal points, respectively. Such detection of the normal and specific signal points is readily possible by monitoring a combination of the second through fourth bit signals $S_{p2}$ to $S_{p4}$ and $S_{q2}$ to $S_{q4}$ in a usual manner. Therefore, the first section 32a will not be described in detail.

In addition, the transmission logic conversion unit 32 produces a pair of three modified bit signals $S_{p2}'$ to $S_{p4}'$ and $S_{q2}'$ to $S_{q4}'$ for the p- and q-channel digital signals in accordance with a truth table illustrated in FIG. 6 when the first through fourth bit signals $S_{p2}$ to $S_{p4}$ and $S_{q2}$ to $S_{q4}$ are representative of the specific signal points a to f.

The dislocated signal points a' to f' can not accurately be represented merely by the six modified bit signals $S_{p2}'$ to $S_{q4}'$ because the dislocated signal points a' to f' are located in the second part which can not be represented by six bits. In order to specify each dislocated signal point, first and second additional bit signals $H_p$ and $H_q$ for the p- and q-channel digital signals are produced by the transmission logic conversion unit 32. Either one of the first and second additional bit signals $H_p$ and $H_q$ takes the logic "1" level when the modified bit signals $S_{p2}'$ to $S_{p4}'$ indicate the second part placed outside of the sixteenth level "16" (FIG. 5) as shown in FIG. 6.

Anyway, either one of the first and second additional bit signals $H_p$ and $H_q$ takes the logic "1" level when the dislocated signal points a' to f' are specified by the modified bit signals $S_{p2}'$ to $S_{q4}'$. On the other hand, both of the first and second additional bit signals take the logic "0" level when the normal signal points are specified by the second through fourth bit signals $S_{p2}$ to $S_{q4}$. In order to produce the modified bit signals and additional bit signals, the transmission logic conversion unit 32 comprises a second section 32b. Such a second section 32b can readily be implemented by a known logic circuit with reference to FIG. 6.

In FIG. 4, the transmission selector 33 selects the second through fourth bit signals $S_{p2}$ to $S_{p4}$ and $S_{q2}$ to $S_{q4}$ produced as a selector output signal when the transmission control signal TCONT takes the logic "0" level and indicates the normal signal points. Otherwise, the transmission selector 33 selects as the selector output signal the modified bit signals $S_{p2}'$ to $S_{p4}'$ and $S_{q2}'$ to $S_{q4}'$ together with the first and second additional control signals $H_p$ and $H_q$. Such a selector can be implemented by a known circuit.

A code converting unit 36 is operable in response to the encoded bit signals given from the transmission differential encoder 31 and to the selector output signal selected by the transmission selector 33. The illustrated code converting unit 36 comprises thirteen Exclusive OR gates and four AND gates and is for use in carrying out the rotation symmetry conversion of the encoded bit signals and the selector output signal. The rotation symmetry conversion is for producing a code converted signal such that signal points of an optional quadrant are given by corresponding codes, respectively, and are also given by the same codes even when the signal points are rotated by $\pi/2$, $\pi$, and $3\pi/2$ around the origin. Such rotation symmetry conversion itself is known in the art and can be carried out by the use of the logic circuit as illustrated in FIG. 4.

As a result of the rotation symmetry conversion, the signal points of the code converted signal do not undergo any adverse influence resulting from uncertainty of four phases of the reference carrier signal.

The code converted signal is divided into first and second converted signal parts for the p- and q-channel digital signals, respectively. The first converted signal part is delivered through a first additional code converter 37p to the first digital-to-analog converter 25p. Likewise, the second converted signal part is delivered through a second additional code converter 37q to the second analog-to-digital converter 25q. The encoded bit signals for the p- and q-channel signals are sent to the first and second digital-to-analog converters 25p and 25q through the code converting unit 36 and the first and second additional code converters 37p and 37q as one bits of the first and second converted signal parts. Each of the first and second additional code converters 37p and 37q is for adjusting codes between the code converted signal and first and second analog output signals AP and AQ of the first and second digital-to-analog converters 25p and 25q. The first and second converted signal parts are further subjected to code conversion by the additional code converters 37p and 37q and sent as first and second digital signals to the digital-to-analog converters 25p and 25q, respectively.

Thus, a combination of the transmission selector 33, the code converting unit 3, and the first and second additional code converters 37a and 37b serves to produce the first and second digital signals in response to both of the transmission control signal TCONT and the second through fourth bit signals of the p- and q-channel signals and may be collectively referred to as a code converter circuit. The second section 32b of the unit 32 may be considered as a part of the code converter circuit.

Each of the first and second digital signals is composed of five bits of which the most significant bit is determined by each of the encoded bit signals given from the transmission differential encoder 31. The most significant bit is indicated at $D_1$ like in FIGS. 1 through 3. The fifth or least significant bits of the first and second modified digital signal are determined by the first and second additional bit signals $H_p$ and $H_q$, as readily understood from FIG. 4, and are given as the control bits $C_0$ (as mentioned in conjunction with FIGS. 1 through 3) to the first and second digital-to-analog converters 25p ahd 25q. A selected one of the control signal bits $C_0$ alone takes the logic "1" level like the first and second additional bit signals $H_p$ and $H_q$ and specifies the dislocated signal points. The remaining bit signals of each digital signal are determined by the first and second additional code converters 37p and 37q.

The first digital-to-analog converter 25p is similar in structure and operation to the second digital-toanalog converter 25q. Each of the first and second digital-to-analog converters 25p and 25q comprises an inverter 41, an Exclusive OR circuit 42, and a digital-to-analog conversion unit 43, like in FIGS. 1 through 3. The illustrated digital-to-analog converters 25p and 25q are supplied with the first and second digital signals. Each of the first and second digital-to-analog converters 25p and 25q recognizes third and fourth bit positions for the third and fourth bit signals as a common bit position. In this connection, the fourth bit signal of each digital signal may be denoted by $D_3'$ and an output signal of the Exclusive OR circuit 42 is indicated at $D_4$.

In a manner similar to that illustrated in FIGS. 1 through 3, first and second analog output signals AP and AQ are produced for the p- and q-channel signals by the first and second analog-to-digital converters 25p and 25q, respectively. Each of the analog output signals AP and AQ takes sixteen different levels when the control signal bit C takes the logic "0" level. Otherwise, each analog output signal takes eighteen different levels.

In the example being illustrated, the first bit signals of the p- and q-channel digital signals are encoded by the differential encoder 31 and the rotation symmetry conversion is carried out for the remaining bit signals. Therefore, it is possible to avoid any uncertainty of phases which may otherwise takes place on reception of the quadrature amplitude modulated signal QAM.

The first and second analog output signals AP and AQ are sent to a modulation circuit 45 to be produced as the quadrature amplitude modulated signal QAM in the known manner.

Figure 7:
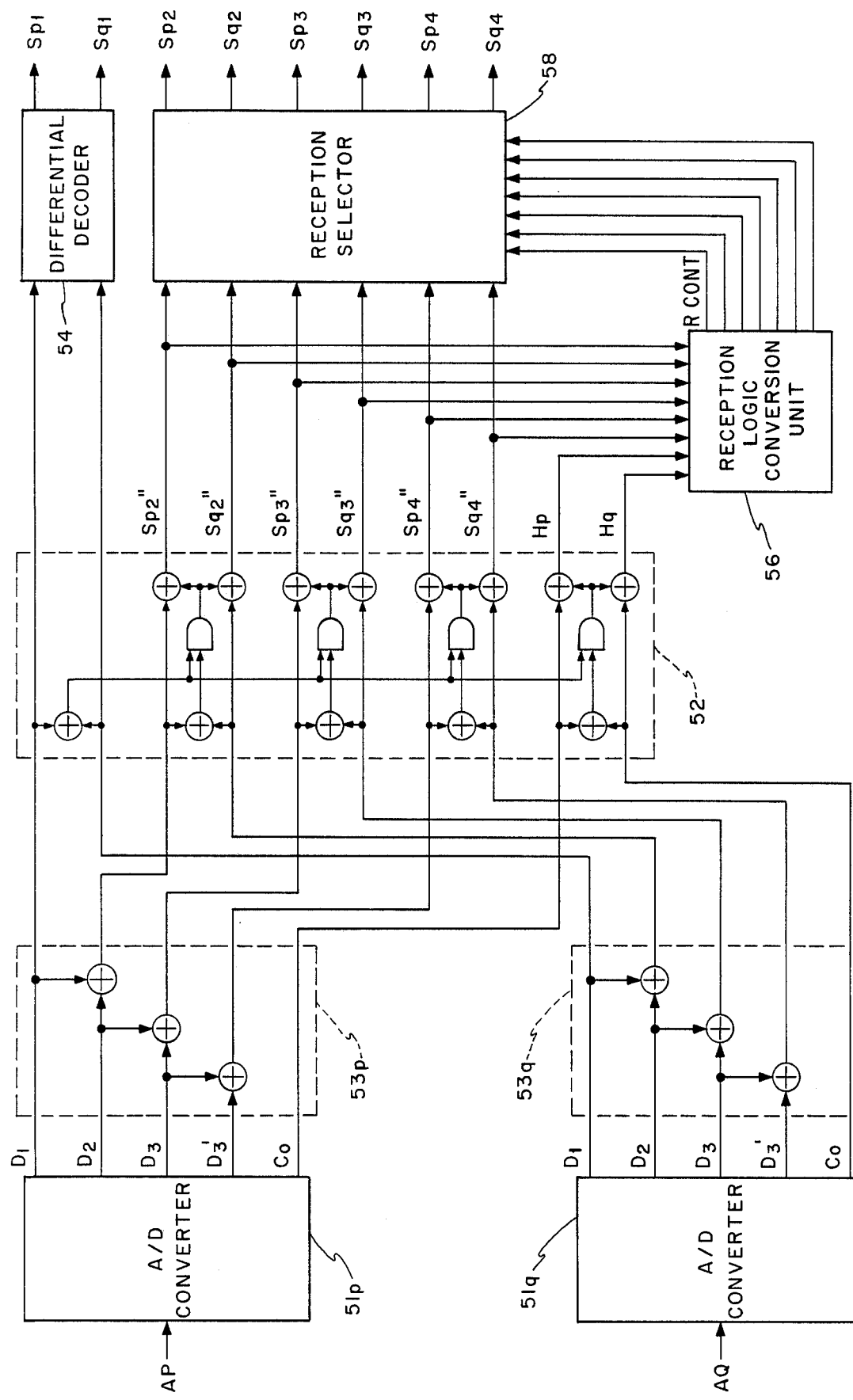

Referring to FIG. 7, a demodulator is for use in combination with the modulator illustrated with reference to FIG. 4 and comprises a coherent detector (not shown) responsive to the quadrature amplitude modulated signal QAM. The coherent detector detects in a known manner first and second reproduced analog signals which correspond to the first and second analog output signals AP and AQ for p- and q-channels, respectively, and which will simply be called first and second analog signals AP and AQ, respectively. Such coherent detection is carried out by the use of a reproduced carrier signal accompanied by no uncertainty of phases, as is readily understood from the above. Each analog signal AP and AQ takes sixteen or eighteen different levels, as mentioned in conjunction with the first and secon digital-to-analog converters 25p and 25q.

The first and second analog signals AP and AQ are delivered to first and second analog-to-digital converters 51p and 51q, respectively. Each analog-to-digital converter 51p and 51q can be implemented by seventeen comparators for comparing the analog signal AP or AQ with threshold levels corresponding to the levels, such as 2, 4, . . . in FIG. 6, and will not be described any longer. In any event, the first analog-to-digital converter 51p produces a reproduction of the first digital signal described in conjunction with FIG. 7. The five bits of the reproduction are therefore denoted by $D_1$, $D_2$, $D_3$, $D_3'$, and $C_0$. Likewise, the second analog-to-digital converter 51q produces a reproduction of the second digital signal of five bits denoted by $D_1$, $D_2$, $D_3$, $D_3'$, and $C_0$.

The first digital signal is delivered to a code converter 52 through a first subsidiary code converter 53p composed of three Exclusive OR gates while the second digital signal is delivered to the code converter 52 through a second subsidiary code converter 53q similar to the first subsidiary code converter 53p. A combination of the code converter 52 and the subsidiary code converters 53p and 53q serves to carry out inverse conversion of the rotation symmetry conversion mentioned in conjunction with FIG. 4. The illustrated code converter 52 comprises thirteen Exclusive OR gates and four AND gates connected to the Exclusive OR gates in a manner illustrated in FIG. 5. Such a code converter is often used to carry out the inverse conversion and will not be described in detail. The illustrated code converter 52 delivers the first bits $D_1$ of the first and second digital signals to a differential decoder 54. The differential decoder 54 reproduces the first bit signals $S_{p1}$ and $S_{q1}$ for the p- and q-channels in the known manner. The code converter 52 produces reproduced signals which correspond to the second through fourth bit signals of the p- and q-channel signals (described in FIG. 4) and which may be called second through fourth reproduced bit signals for p- and q-channels. In FIG. 7, the second through fourth reproduced bit signals for p-channel are denoted by $S_{p2}''$, $S_{p3}''$, and $S_{p4}''$, respectively, while the second are denoted by $S_{q2}''$, $S_{q3}''$, and $S_{q4}''$, respectively. In addition, the code converter 52 produces first and second reproduced additional bit signals which correspond to the first and second additional bit signals $H_p$ and $H_q$, respectively, and which are denoted by the same reference symbols $H_p$ and $H_q$, respectively.

The reproduced additional bit signals $H_p$ and $H_q$ are sent to a reception logic conversion unit 56 together with the second through fourth reproduced bit signals $S_{p2}''$ to $S_{q4}''$. The second through fourth reproduced bit signals $S_{p2}''$ to Sq4" are also sent to a reception selector 58.

When both of the first and second reproduced additional bit signals $H_p$ and $H_q$ / take the logic "0" level, the second through fourth reproduced bit signals $S_{p2}''$ to $S_{p4}''$ and $S_{q2}''$ to $S_{q4}''$ are representative of the normal signal points (described with reference to FIG. 6) and are coincident with the second through fourth bit signals $S_{p2}$ to $S_{p4}$ and $S_{q2}$ to $S_{q4}$, respectively. In this event, the reception logic conversion unit 52 delivers the logic "0" level as a reception control signal RCONT to the reception selector 58. When the reception control signal RCONT takes the logic "1" level, the reception selector 58 produce the second through fourth reproduced bit signals $S_{p2}''$ to $S_{p4}''$ and $S_{q2}''$ to $S_{q4}''$ as reproductions of the first through fourth bit signals $S_{p2}$ to $S_{p4}$ and $S_{q2}$ to $S_{q4}$, respectively.

On the other hand, when either one of the first and second reproduced additional bit signals $H_p$ and $H_q$ takes the logic "1" level, the reception logic conversion unit 56 delivers the logic "1" level as the reception control signal RCONT to the reception selector 58. In this event, the reproduced bit signals $S_{p2}''$ to $S_{q4}''$ are coincident with the modified bit signals $S_{p2}'$ to $S_{q4}'$ illustrated in FIG. 4 and are representative of the dislocated signal points a' to f' (FIG. 6). The dislocated signal points a' to f' should be returned back to the specific signal points a to f. For this purpose, the reception logic conversion unit 56 converts the reproduced bit signals $S_{p2}''$ to $S_{q4}''$ into the corresponding bit signals which are sent to the reception selector 58. The bit signals converted by the reception logic conversion unit 56 are selected by the reception selector 58 and produced as the reproductions of the second through fourth bit signals $S_{p1}$ to $S_{q4}$.

While this invention has thus far been described in conjunction with several embodiments thereof, it will readily be possible for those skilled in the art to put this invention into practice in various other manners. For example, the number of the signal points may be $2^{2n}$, where n is an integer which is equal to or greater than three, although description was restricted to the case where n is equal to four. Rotation symmetry conversion and inverse conversion thereof may not be performed, if uncertainty of the four phases is removed on demodulation in a manner such that a reference signal is superposed on a carrier wave signal. In this event, there is no need of the transmission differential encoder 31 and transmission code converting circuits, such as 36, 37p, and 37q together with the differential decoder 54 and reception code converting circuits, such as 52, 53p, and 53q. In FIGS. 1 through 3, three or more bits of the digital input signal may be recognized as a single common bit.

What is claimed is:

1. A digital-to-analog converter for converting a digital input signal of x number of bits into an analog output signal, where is is an integer which is not smaller than three, and where x bits are consecutively placed at first through x-th bit positions, respectively, said analog output signal taking a plurality of levels, wherein the improvement comprises:

processing means responsive to said digital input signal for processing at least two of said x bit positions as a common bit position to produce a processed digital signal of x number of bits having said common bit position, whereby after said processing siad original digital input signal of x bits becomes a processed digital signal having the same x-number of bits; and converting means for converting said processed digital signal into the analog output signal which takes the levels of a number which is different from $2^x$.

2. A digital-to-analog converter as claimed in claim 1, wherein at least two bit positions of the remaining bit positions except said at least two bit positions are processed as an additional common bit position.

3. A digital-to-analog converter for use in converting a digital input signal of x bits into an analog output signal, where x is an integer which is not smaller than three, said x bits being consecutively placed at first through x-th bit positins, respectively, said analog output signal taking a plurality of levels, wherein the improvement comprises:

processing means responsive to said digital input signal for processing at least two of said x bit positions as a common bit position to produce a processed digital signal having said common bit position; said processing means comprising:

means responsive to said digital input signal for recognizing said at least two of said x bit positions as said common bit position to produce a recognized signal of the x bits which include said common bit position and which are numbered from first through x-th bits;

means responsive to i-th and (i+1)-th bits of said recognized signal for modifying said (i+1)-th bit by said i-th bit into a modivied (i+1)-th bit with said i-th bit kept unchanged, to produce said i-th bit and said modified (i+1)-th bit, where i is an integer between unity and x, both exclusive;

means responsive to said i-th bit, said modified (i+1)-th bit, and the remaining bits of said recognized signal for producing said processed digital signal; and converting means for converting said processed digital signal into the analog signal which takes the levels of a number which is different from $2^x$.

4. A modulator for use in modulating a pair of quadrature-phase carrier signals by a first and a second digital input signal into an amplitude modulated analog signal, each of said first and second digital input signals being represented by N bits where N represents an integer which is not smaller than three, said amplitude modulated analog signal having an amplitude and phase specified by $M^2$ signal points on a phase plane where M is equal to $2^N$, said $M^2$ signal points being divisible into normal and specific signal points in a square distribution and divisible into a first part for said normal signal points and a second part for dislocated signal points given by dislocating said specific signal points in a circular distribution, wherein the improvement comprises:

determining means responsive to said first and second digital input signals for determining whether said first and second digital input signals are representative of either of said normal and specific signal points to produce a control signal representative of either of said first and second parts;

code converting means responsive to said control signal and said first and second digital input signals for converting said first and second digital input signals with reference to said control signal into first and second converted digital signals each of which has a preselected number of bit positions different from said N bits to specify said circular distribution;

digital-to-analog converting means for individually converting said first and second converted digital signals into first and second analog signals, respectively, each of which takes amplitudes of a number which is different from $2^N$, by processing at least two of said preselected number of bit positions as a common bit position; and means for combining said first and second analog signals into said amplitude modulated analog signal.

5. A modulator as claimed in claim 4, wherein said code converting means comprises:

producing means responsive to said first and second digital input signals for producing first and second modified signals which are representative of said dislocated signal points and which correspond to said first and second digital input signals, respectively, said producing means being for further producing first and second additional control signals specifying said specific signal points in relation to said first and second digital input signals, respectively;

selecting means responsive to said control signal, said first and second digital input signals, and said first and second modified signals for selecting said first and second modified signals when said control signal is representative of said specific signal points and, otherwise, for selecting said first and second digital input signals; and conversion means responsive to said first and second additional control signals and coupled to said selecting means for converting either of said first and second digital input signals and said first and second modified signals in consideration of said first and second additional control signals to produce said first and second converted signals.

6. A modulator as claimed in claim 5, wherein said conversion means carries out rotation symmetry conversion.

7. A demodulator for use in combination with the modulator of claim 4, said demodulator being supplied with reproductions of said first and second analog signals and comprising:

analog-to-digital converting means for converting said reproductions of the first and second analog signals into first and second reproduced digital signals corresponding to said first and second converted signals, respectively; and means responsive to said first and second reproduced digital signals for producing first and second reproductions of said first and second digital input signals.

* * * * *